US007790490B2

(12) United States Patent
Caliano et al.

(10) Patent No.: US 7,790,490 B2
(45) Date of Patent: Sep. 7, 2010

(54) SURFACE MICROMECHANICAL PROCESS FOR MANUFACTURING MICROMACHINED CAPACITIVE ULTRA-ACOUSTIC TRANSDUCERS AND RELEVANT MICROMACHINED CAPACITIVE ULTRA-ACOUSTIC TRANSDUCER

(75) Inventors: Giosuè Caliano, Via Grimaldi 102, Rome (IT); Alessandro Caronti, Via Cesare Lombroso, 109 - Rome (IT); Vittorio Foglietti, Rome (IT); Elena Cianci, Rome (IT); Antonio Minotti, Rome (IT); Alessandro Nencioni, Casale Monferrato (IT); Massimo Pappalardo, Via G. Spontini, 22 - Rome (IT)

(73) Assignees: Consiglio Nazionale Delle Ricerche, Rome (IT); Esaote S.p.A., Milan (IT); Massimo Pappalardo, Rome (IT); Giosuè Caliano, Rome (IT); Alessandro Stuart Savoia, Rome (IT); Alessandro Caronti, Rome (IT); Cristina Longo, Pietramontecorvino - Foggia (IT); Philipp Gatta, Rome (IT)

( * ) Notice: Subject to any disclaimer, the term of this patent is extended or adjusted under 35 U.S.C. 154(b) by 0 days.

(21) Appl. No.: 11/817,621

(22) PCT Filed: Mar. 2, 2006

(86) PCT No.: PCT/IT2006/000126

§ 371 (c)(1),
(2), (4) Date: Nov. 27, 2007

(87) PCT Pub. No.: WO2006/092820

PCT Pub. Date: Sep. 8, 2006

(65) Prior Publication Data

US 2008/0212407 A1 Sep. 4, 2008

(30) Foreign Application Priority Data

Mar. 4, 2005 (IT) .................... RM2005A000093

(51) Int. Cl.
*H01L 21/00* (2006.01)

(52) U.S. Cl. ........................ 438/48; 438/421; 438/422; 438/456; 257/E21.214; 257/E21.483

(58) Field of Classification Search .................. 438/42, 438/43, 422; 257/E21.483, E21.484
See application file for complete search history.

(56) References Cited

U.S. PATENT DOCUMENTS 5,870,351 A 2/1999 Ladabaum et al.

(Continued)

FOREIGN PATENT DOCUMENTS

FR 2 721 471 A 12/1995

OTHER PUBLICATIONS

Xuecheng Jin et al: "Fabrication and Characterization of Surface Micromachined Capacitive Ultrasonic Immersion Transducers" Journal of Microelectromechanical Systems, IEEE Service Center, Piscataway, NJ, US, vol. 8, No. 1, Mar. 1999, XP011034832.

(Continued)

*Primary Examiner*—Charles D Garber
*Assistant Examiner*—Cheung Lee
(74) *Attorney, Agent, or Firm*—Stanislaus Aksman; Roberts Mlotkowski Safran & Cole, P.C.

(57) ABSTRACT

The invention concerns a manufacturing process, and the related micromachined capacitive ultra-acoustic transducer, that uses commercial silicon wafer 8 already covered on at least one or, more preferably, on both faces by an upper layer 9 and by a lower layer 9' of silicon nitride deposited with low pressure chemical vapour deposition technique, or deposition LPCVD deposition. One of the two layers 9 or 9' of silicon nitride, of optimal quality, covering the wafer 8 is used as emitting membrane of the transducer. As a consequence, the micro-cell array 6 forming the CMUT transducer is grown onto one of the two layers of silicon nitride, i.e. it is grown at the back of the transducer with a sequence of steps that is reversed with respect to the classical technology.

43 Claims, 6 Drawing Sheets

U.S. PATENT DOCUMENTS

| | | | | |
|---|---|---|---|---|
| 5,894,452 | A | 4/1999 | Ladabaum et al. | |
| 6,958,255 | B2 | 10/2005 | Khuri-Yakub et al. | |
| 2001/0043029 | A1 | 11/2001 | Ladabaum | |
| 2002/0149298 | A1 * | 10/2002 | Furukawa et al. | 310/340 |
| 2003/0114760 | A1 | 6/2003 | Robinson | |
| 2004/0085858 | A1 | 5/2004 | Khuri-Yakub et al. | |
| 2004/0180466 | A1 * | 9/2004 | Foglietti et al. | 438/53 |
| 2005/0177045 | A1 * | 8/2005 | Degertekin et al. | 600/457 |
| 2006/0116585 | A1 * | 6/2006 | Nguyen-Dinh et al. | 600/459 |
| 2007/0086274 | A1 * | 4/2007 | Nishimura et al. | 367/140 |

OTHER PUBLICATIONS

Xuecheng Jin et al: "Fabrication and Characterization of Surface Micromachined Capacitive Ultrasonic Immersion Transducers" IEEE Journal of Microelectromechanical Systems, IEEE Service Center, Piscataway, NJ, US, vol. 8, No. 1, Mar. 1999, XP011034832.

Xueching Jin et al: "The Microfabrication of Capacitive Ultrasonic Transducers" Journal of Microelectromechanical Systems, IEEE Service Center, US, vol. 7, No. 3, Sep. 1998.

R.A. Noble et al: "Novel Silicon Nitride Micromachined Wide Bandwidth Ultrasonic Transducers" 1998 IEEE Ultrasonics Symposium-1081, IEEE Service Center, 1998.

Igal Ladabaum et al: "Surface Micromachined Capacitive Ultrasonic Transducers" IEEE Transactions On Ultrasonics, Ferroelectrics, and Frequency Control, vol. 45, No. 3, May 1998.

* cited by examiner

SURFACE MICROMECHANICAL PROCESS FOR MANUFACTURING MICROMACHINED CAPACITIVE ULTRA-ACOUSTIC TRANSDUCERS AND RELEVANT MICROMACHINED CAPACITIVE ULTRA-ACOUSTIC TRANSDUCER

CROSS-REFERENCE TO RELATED APPLICATIONS

This application is a 35 U.S.C. §371 of International Application No. PCT/IT2006/000126 filed Mar. 2, 2006, which claims priority from Italian patent application RM2005A000093, filed Mar. 4, 2005, the entire contents of which, including amendments made in the International Application, are incorporated herein by reference.

FIELD OF THE INVENTION

The present invention concerns a surface micromechanical process for manufacturing micromachined capacitive ultra-acoustic transducers, or CMUT (Capacitive Micromachined Ultrasonic Transducers), and the related CMUT device, that allows, in a simple, reliable, and inexpensive way, to make CMUTs having uniform and substantially porosity free structural membranes, operating at extremely high frequencies with very high efficiency and sensitivity, the electrical contacts of which are located in the back part of the CMUT, the process requiring a reduced number of lithographic masks in respect to conventional processes.

BACKGROUND OF THE INVENTION

In the second half of the last century a great number of echographic systems have been developed, capable to obtain information from surrounding means and from human body, which are based on the use of elastic waves at ultrasonic frequency.

Presently, the performance limit of these systems is due to the devices capable to generate and detect ultrasonic waves. Thanks to the great development of microelectronics and digital signal processing, both the band and the sensitivity, and the cost of these systems as well, are substantially determined by these specialised devices, generally called ultrasonic transducers (UTs).

The majority of UTs are made by using piezoelectric ceramics. When ultrasounds are used for obtaining information from solid materials, it is sufficient the employment of the sole piezoceramic, since the acoustic impedance of the same is of the same magnitude order of that of solids. On the other hand, in most applications it is required generation and reception in fluids, and hence piezoceramic is insufficient because of the great impedance mismatching existing between the same and fluids and tissues of the human body In order to improve the performances of UTs, two techniques have been developed: matching layers of suitable acoustic impedance, and composite ceramic. With the first technique, the low acoustic impedance is coupled to the much higher one of ceramic through one or more layers of suitable material and of thickness equal to a quarter of the wavelength; with the second technique, it is made an attempt to lower the acoustic impedance of piezoceramic by forming a composite made of this active material and an inert material having lower acoustic impedance (typically epoxy resin). These two techniques are nowadays simultaneously used, considerably increasing the complexity of these devices and consequently increasing costs and decreasing reliability. Also, the present multi-element piezoelectric transducers have strong limitations as to geometry, since the size of the single elements must be of the order of the wavelength (fractions of millimeter), and to electric wiring, since the number of elements is very large, up to some thousands in case of array multi-element transducers.

In order to solve these problems, the electrostatic effect is exploited, that is a valid alternative to the piezoelectric effect for making ultrasonic transducers. Electrostatic ultrasonic transducers, made of a thin metallised membrane (mylar) typically stretched over a metallic plate (also called rear plate or "backplate"), have been used since 1950 for emitting ultrasounds in air, while the first attempts of emission in water with devices of this kind were on 1972. These devices are based on the electrostatic attraction exerted on the membrane which is thus forced to flexurally vibrate when an alternate voltage is applied between it and the backplate; during reception, when the membrane is set in vibration by an acoustic wave, incident on it, the capacity modulation due to the membrane movement is used to detect the wave.

The resonance frequency of these devices is controlled by the membrane tensile stress, by its side size and by the thickness as well as the backplate surface roughness. Typically for emission in air, the resonance frequency is of the order of hundred of KHz, when the backplate surface is obtained through a turning or milling mechanical machining.

In order to increase the resonance frequency and to control its value, transducers have been developed which employ a silicon backplate, suitably doped to make it conductive, the surface of which presents a fine structure of micrometric holes having truncated pyramid shape, obtained through micromachining, i.e. through masking and chemical etching. With transducers of this type, known as "bulk micromachined ultrasonic transducers", maximum frequencies of about 1 MHz for emission in water and bandwidths of about 80% are reached. However, the characteristics of these devices are strongly dependent on the tension applied to the membrane which may not be easily controlled.

It has been recently developed a new generation of micromachined silicon capacitive ultrasonic transducers known as "surface micromachined ultrasonic transducers" or also as Capacitive Micromachined Ultrasonic Transducers (CMUTs). CMUTs, and related processes of manufacturing through silicon micromachining technology, have been described, for instance, by X. Jin, I. Ladabaum, F. L. Degertekin, S. Calmes, and B. T. Khuri-Yakub in "*Fabrication and characterization of surface micromachined capacitive ultrasonic immersion transducers*", J. Microelectromech. Syst., vol. 8(1), pp. 100-114, September 1998, by X. Jin, I. Ladabaum, and B. T. Khuri-Yakub in "*The microfabrication of capacitive ultrasonic Transducers*", Journal of Microelectromechanical Systems, vol. 7 No 3, pp. 295-302, September 1998, by I. Ladabaum, X. Jin, H. T. Soh, A. Atalar and B. T. Khuri-Yakub in "*Surface micromachined capacitive ultrasonic transducers*", IEEE Trans. Ultrason. Ferroelect. Freq. Contr., vol. 45, pp. 678-690, May 1998, by U.S. Pat. No. 5,870,351 to I. Ladabaum et al., by U.S. Pat. No. 5,894,452 to I. Ladabaum et al., and by R. A. Noble, R. J. Bozeat, T. J. Robertson, D. R. Billson and D. A. Hutchins in "*Novel silicon nitride micromachined wide bandwidth ultrasonic transducers*", IEEE Ultrasonics Symposium isbn:0-7803-4095-7, 1998.

These transducers are made of a bidimensional array of electrostatic micro-cells, electrically connected in parallel so as to be driven in phase, obtained through surface micromachining. In order to obtain transducers capable to operate in the range 1-15 MHz, typical in many echographic applications for non-destructive tests and medical diagnostics, the micro-membrane lateral size of each cell is of the order of ten microns; moreover, in order to have a sufficient sensitivity, the number of cells necessary to make a typical element of a multi-element transducer is of the order of some thousands.

The process for manufacturing CMUT transducers is based on the use of silicon micromachining. In order to make the base structure of a CMUT transducer, that is an array of micro-cells each provided with a metallised membrane stretched over a fixed electrode (lower electrode), six thin film deposition and six photolithographic steps are generally employed.

The device is grown onto the oxidised surface of a silicon substrate. The lower electrodes of the micro-cells are obtained through photolithographic etching of a metallic layer deposited onto the oxide layer of the silicon substrate. The thus obtained electrodes are protected through a thin layer of silicon nitride that is generally deposited with PECVD techniques.

In order to obtain the micro-cell structure, a sacrificial layer (for example of chromium) is deposited, through evaporation, onto the silicon nitride layer. Through a new photolithographic step, the sacrificial layer is etched so as to form a set of small circular islands which will define the cavity underlying the membrane of the single micro-cells. A silicon nitride layer is then deposited on the whole surface of the substrate so as to cover the surface of the circular islands of sacrificial material. This layer will constitute the membranes of the single micro-cells.

In fact, these membranes are released through a wet etching of the sacrificial layer that acts through small holes, made through a dry etching with reactive ions, or RIE (Reactive Ion Etching) etching, through the same membranes, in other words through the silicon nitride layer covering the islands of sacrificial material.

FIG. 1 shows the image, obtained through a scanning electron microscope or SEM, of a section of a silicon nitride membrane suspended over a cavity. It should be noted the typical shape of the cavity that is extremely long with respect to the thickness.

The critical step of this technology is the indispensable closure of the holes made through the micro-membranes, necessary for emptying the cavities of the sacrificial material. Closure of these holes, even if not necessary from the functional point of view (emission and reception of acoustic waves), is indispensable, in practical applications, for preventing the same cavities from being filled with liquids and also wet gases with evident decay of performance.

To this end, it is used a subsequent deposition of silicon nitride of thickness such as to close the holes without, however, excessively penetrating under the active part of the membrane. The nitride layer that is deposited onto the membranes is afterwards removed in order not to alter the membrane thickness, that is a parameter strongly affecting the performance of the device.

For completing the device, a layer of aluminium is then deposited, that is subsequently etched through photolithography, so as to form the upper electrodes of the micro-membranes and the related electric interconnections. Finally, a thin layer of silicon nitride is deposited onto the device in order to passivate it and insulate the same from the external ambience.

FIG. 2 shows an image obtained through optical microscope of a portion of a finished device. Since nitride is transparent, there may be noted the micro-cavities 1 on which the membranes are suspended, the closed emptying holes 2, the electrodes 3 having radius lower than that of the membranes, and finally the electric interconnections 4.

However, conventional processes for manufacturing CMUT transducers, through micromachining, present some limitations.

First of all, the holes made onto the membrane surface, necessary for removing the sacrificial material, perturb the membrane uniformity.

Moreover, filling and sealing the holes, after releasing the membranes, are of difficult achievement. In particular, such step is certainly critical along the whole process for manufacturing CMUTs, and it has been often identified as possible cause of unsuccessful operation of the devices. Hole elimination, at least on the structural membrane in contact with the propagation environment, alone would produce evident advantages.

Furthermore, as also disclosed in literature, silicon nitride, of which the structural membrane is constituted, is intrinsically porous. The porosity of the nitride so far used in technological processes of CMUTs is to be investigated in the used deposition method. In fact, PECVD technique, although offering other advantages (low temperatures of deposition and possibility of varying with continuity the film mechanical characteristics), produces a porous nitride film. The attempts of solving such problem, through increasing the nitride thicknesses (by consequently reducing the membrane porosity), are not adequate, because they vary in a unacceptable way the electro-acoustic characteristics of the membranes.

Still, conventional processes for manufacturing CMUT transducers generally use seven lithographic masks. A so large number of masks involves a consequently long time for machining a silicon wafer. Moreover, the possibility of introducing errors in alignment is similarly high.

Finally, present technology provides the presence of transducer connection pads on the same surface of the active elements. Although from the point of view of simplicity this is the best solution, it is not so for the packaging problems. In fact, the best solution in this case provides the presence of the contacts in the device back part. In this regard, in literature CMUT devices have been described which use connection pads located on the back surface of the same device, but to this end techniques have been used for making deep trenches crossing the whole silicon wafer with related metallisation of the inner surfaces of the resulting holes.

Document US-A-2004/0085858, U.S. Pat. No. 6,958,255, discloses a surface micromechanical process for manufacturing one or more micromachined capacitive ultra-acoustic transducers, each one of which comprises one or more electrostatic micro-cells, each micro-cell comprising a membrane of conductive elastic material suspended over a conductive substrate, comprising the step of having a semi-finished product comprising a silicon wafer having a face covered by a first layer of elastic material.

Document FR-A-2721471 discloses a surface micromechanical process for manufacturing one or more micromachined ultrasonic transducers having a variable capacity, each one of which comprises one or more electrostatic micro-cells provided with a plurality of apertures, each micro-cell comprising a membrane of conductive elastic material suspended over a conductive substrate, comprising the step of having a semi-finished product comprising a silicon wafer having a face covered by a first layer of elastic material.

Document US-A-2003/0114760 discloses a conventional surface micromechanical process for manufacturing one or more micromachined capacitive ultra-acoustic transducers, further comprising, afterwards the CMUT formation, steps for providing an acoustically-damped region below the MUTs to substantially inhibit the propagation of acoustic waves in the substrate.

Document US-A-2001/0043029 refers to a conventional surface micromechanical process for manufacturing CMUTs having vibrating membranes separated from the silicon wafer and provided with conductive layers placed over the membranes.

SUMMARY OF THE INVENTION

It is therefore an object of the present invention to provide a surface micromechanical process for manufacturing micromachined capacitive ultra-acoustic transducers, that allows, in a simple, reliable, and inexpensive way, to make CMUTs having uniform and substantially porosity free structural membranes, operating at extremely high frequencies with very high efficiency and sensitivity, the electrical contacts of which are located in the back part of the CMUT.

It is therefore another object of the present invention to provide such a process that requires a reduced number of lithographic masks in respect to conventional manufacturing processes.

It is specific subject matter of this invention a surface micromechanical process for manufacturing one or more micromachined capacitive ultra-acoustic transducers, each one of which comprises one or more electrostatic micro-cells, each micro-cell comprising a membrane of conductive elastic material suspended over a conductive substrate, characterised in that it comprises the following steps:

A. having a semi-finished product comprising a silicon wafer having a face covered by a first layer of elastic material;

B. making, onto the first elastic material layer and outside the silicon wafer, the conductive substrate of at least one micro-cell so that it is separated from the first elastic material layer by a cavity; and C. in correspondence with said at least one micro-cell, digging the silicon wafer, starting from the face opposite to that covered by the first elastic material layer, for uncovering the surface of the first elastic material layer, whereby, in correspondence with said at least one micro-cell, the first elastic material layer is at least partially integrated into the membrane of said at least one micro-cell.

Preferably according to the invention, the material of the first layer covering said face of the silicon wafer comprises silicon nitride.

Also according to the invention, the silicon nitride of the first layer covering said face of the silicon wafer may be obtained through low pressure chemical vapour deposition or LPCVD deposition.

Still according to the invention, the silicon wafer may further comprise, above the first elastic material layer covering said face, a first metallic layer, whereby the conductive elastic material membrane comprises at least one portion of the first elastic material layer, covering a face of the silicon wafer, and at least one corresponding portion of the first metallic layer that is capable to operate as front electrode of said at least one micro-cell.

Furthermore according to the invention, step B may further comprise:

B.1 making a first metallic layer onto the first elastic material layer covering said face of the silicon wafer, whereby the conductive elastic material membrane comprises at least one portion of the first elastic material layer, covering a face of the silicon wafer, and at least one corresponding portion of the first metallic layer that is capable to operate as front electrode of said at least one micro-cell.

Also according to the invention, the first metallic layer may be made through evaporation.

Still according to the invention, the first metallic layer may comprise gold.

Furthermore according to the invention, step B may comprise:

B.2 making a sacrificial layer above the first metallic layer;

B.3 for said at least one micro-cell, defining a corresponding sacrificial island within the sacrificial layer;

B.4 making, above the sacrificial island, a layer of backplate of said one or more micromachined capacitive ultra-acoustic transducers;

B.5 making at least one hole within the backplate layer in correspondence of the sacrificial island;

B.6 removing the sacrificial island, thus creating the cavity of said at least one micro-cell;

B.7 making a sealing conformal layer for sealing said at least one hole through at least one corresponding closing cap obtained from the sealing conformal layer.

Also according to the invention, in step B.2, the sacrificial layer may be made through evaporation.

Still according to the invention, the sacrificial layer may comprise chromium.

Furthermore according to the invention, the sacrificial island defined in step B.3 may have a substantially circular shape.

Also according to the invention, step B.3 may define the sacrificial island through optical lithography followed by selective etching, preferably wet etching, of said sacrificial layer.

Still according to the invention, in step B.4, the backplate layer may comprise silicon nitride made through plasma enhanced chemical vapour deposition, or PECVD deposition.

Furthermore according to the invention, the backplate layer may have thickness not lower than 400 nm.

Also according to the invention, in step B.5, said at least one hole may be made through optical lithography followed by selective etching said backplate layer.

Still according to the invention, in step B.6, the sacrificial island may be removed through selective etching.

Also according to the invention, in step B.7, the sealing conformal layer may comprise silicon nitride made through PECVD deposition.

Furthermore according to the invention, the process may comprise, after step B.4 and before step B.7, the following step:

B.8 for said at least one micro-cell, making a corresponding back metallic electrode above the backplate layer.

Also according to the invention, in step B.8, the back metallic electrode may be made by making a second conformal metallic layer that is afterwards defined through optical lithography followed by selective etching of said conformal metallic layer.

Still according to the invention, the back metallic electrode may comprise an alloy of aluminium and titanium.

Furthermore according to the invention, step B.8 may be carried out before step B.5.

Also according to the invention, the process may comprise, just after step B.8, the following step:

B.9 covering the back metallic electrode with a conformal protective dielectric film.

Still according to the invention, the conformal protective dielectric film may comprise silicon nitride made through PECVD deposition.

Furthermore according to the invention, in step B.5, one or more apertures may be made for uncovering areas corresponding to one or more pads contacting the front electrode of said at least one micro-cell.

Also according to the invention, in step B.5, said one or more apertures may be made through optical lithography followed by selective etching.

Still according to the invention, the process may further comprise, after step B.7, the following step:

B.10 making one or more first apertures, for uncovering areas corresponding to one or more pads contacting the front electrode of said at least one micro-cell, and one or more second apertures, for uncovering areas corresponding to one or more pads contacting the back electrode of said at least one micro-cell.

Furthermore according to the invention, in step B.10, said one or more first apertures may be made through optical lithography followed by selective etching.

Also according to the invention, the process may further comprise, after step B.10, the following step:

B.11 welding respective metallic contacts on at least one of said one or more pads contacting the front electrode and on at least one of said one or more pads contacting the back electrode.

Still according to the invention, step C may comprise anisotropically etching the silicon of the wafer, preferably in potassium hydroxide (KOH).

Furthermore according to the invention, the process may further comprise, after step B, the following step:

D. covering the conductive substrate of said at least one micro-cell with a protective layer, preferably of thermosetting resin.

Also according to the invention, said face of the silicon wafer, opposite to that covered by the first elastic material layer, may be covered by a second layer of elastic material, and the process may further comprise, before step C, the following step:

E. making, in correspondence with said at least one micro-cell, a respective window within said second elastic material layer.

Still according to the invention, the elastic material of the second layer may be the same elastic material of the first elastic material layer.

Furthermore according to the invention, in step E, the window may be made through optical lithography and selective etching of the second elastic material layer.

Also according to the invention, the first elastic material layer that is at least partially integrated into said membrane of said at least one micro-cell may have a thickness of 1 μm.

Still according to the invention, the silicon wafer may have an orientation of the crystallographic planes of (100) type.

Furthermore according to the invention, the silicon wafer may have at least the face covered by the first elastic material layer that is optically polished.

It is further subject matter of the present invention a micromachined capacitive ultra-acoustic transducer, comprising one or more electrostatic micro-cells, each micro-cell comprising a membrane of conductive elastic material suspended over a conductive substrate, characterised in that it is made according to the previously described surface micromechanical process of manufacturing.

BRIEF DESCRIPTION OF THE DRAWINGS

The present invention will be now described, by way of illustration and not by way of limitation, according to its preferred embodiments, by particularly referring to the Figures of the enclosed drawings, in which:

FIGS. 4-19 schematically show the steps of the preferred embodiment of the surface micromechanical process for manufacturing CMUT transducers according to the invention.

DETAILED DESCRIPTION

In the following of the description same references will be used to indicate alike elements in the Figures.

Figure 1:
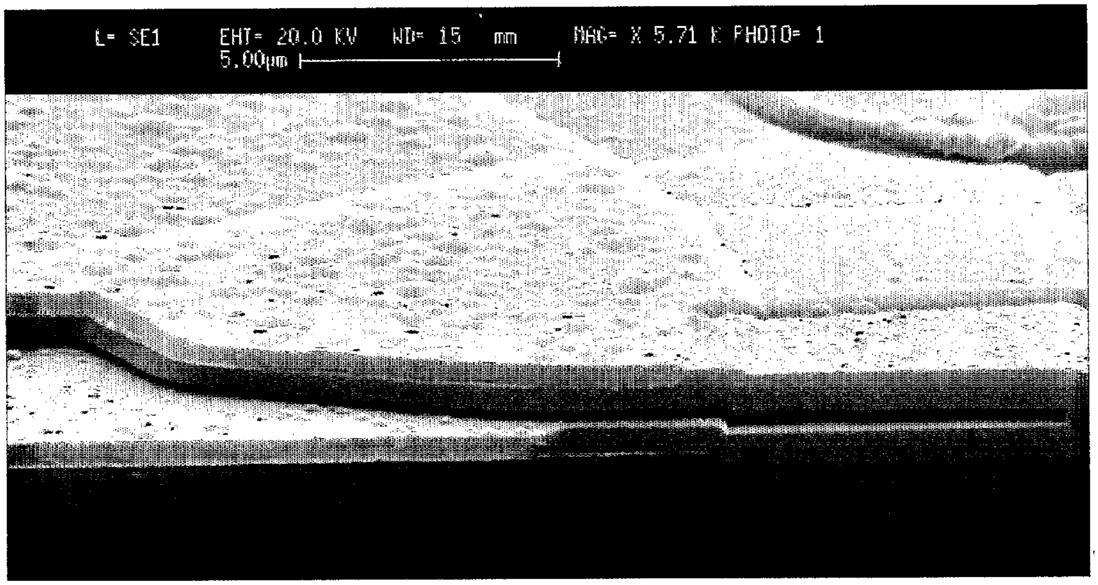
FIG. 1 shows the SEM image of a section of a portion of a first CMUT transducer according to the prior art.
Figure 2:
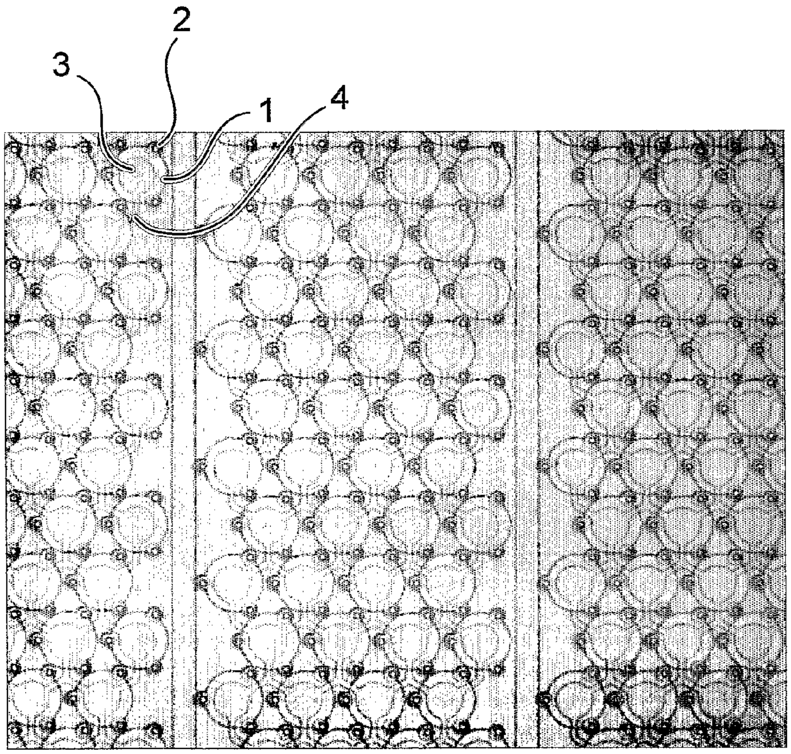
FIG. 2 shows a SEM top image of a portion of a second CMUT transducer according to the prior art.
Figure 3:
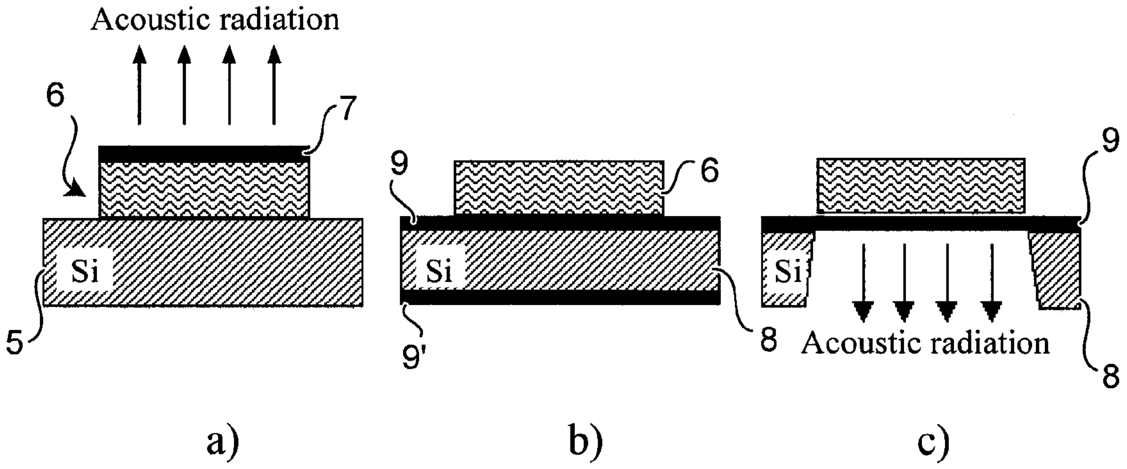
FIGS. 3*a*-3*c* schematically show a section, respectively, of a third CMUT transducer according to the prior art, of an intermediate semi-finished product obtained by a preferred embodiment of the process according to the invention, and of a preferred embodiment of the CMUT transducer according to the invention.

The inventors have developed an innovative process for manufacturing CMUT transducers by machining the device from the back part, instead of the front one, as it has been conventionally done so far. In particular, FIG. 3 schematically shows the differences between conventional processes and the process according to the invention.

As shown in FIG. 3*a*, the previously described classical technique for micromachining ultrasonic CMUT transducers consists in growing onto a silicon wafer 5 the bidimensional array 6 of electrostatic micro-cells forming a CMUT transducer through processes of deposition and subsequent etching. The last layer that is deposited is a layer 7 of silicon nitride, which will constitute the transducer vibrating membrane, i.e. the surface that will come into contact with the environment, while the silicon substrate 5 will constitute the back of the same CMUT transducer, operating as mechanical support.

Instead, as shown in FIG. 3*b*, the micro-manufacturing process according to the invention uses commercial silicon substrates 8 which are already covered on at least one or, more preferably, on both faces by an upper layer 9 and a lower layer 9' of silicon nitride deposited with low pressure chemical vapour deposition technique, or LPCVD deposition. The characteristic of the process according to the invention is that of using, as transducer emitting membrane, one of the two layers 9 or 9' of silicon nitride, of optimal quality, covering the substrate 8. As a consequence, the micro-cell array 6 forming the CMUT transducer is grown, still through succeeding processes of deposition and etching, onto the silicon nitride layer from the afore mentioned two ones (namely, in FIG. 3*b*, the upper layer 9), that will be used as emitting membrane of the transducer micro-cells. In other words, the micro-cell array 6 is grown in the rear of the transducer with a sequence of steps that is reversed with respect to the classical technology. As shown in FIG. 3*c*, in order to allow the contact between the nitride membrane and the environment in which acoustic radiation must be emitted, a digging is finally made into the silicon substrate 8 down to uncover the front surface of the silicon nitride layer 9, operating as transducer emitting membrane.

The steps of a preferred embodiment of the manufacturing process according to the invention are illustrated in greater detail in the following with reference to FIGS. 4-19.

Figure 4:
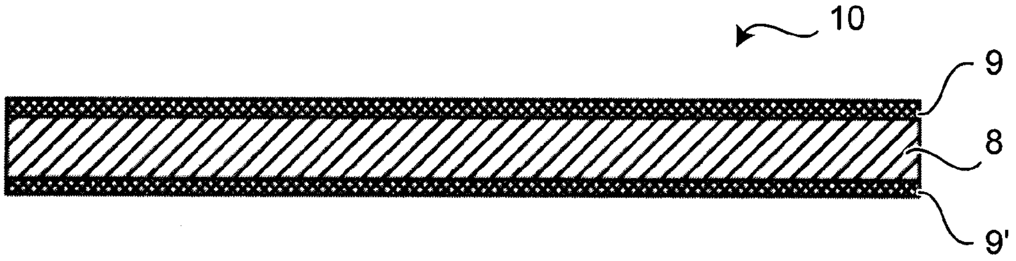

As shown in FIG. 4, the micromachining process uses as starting semi-finished product 10 a silicon wafer 8 covered on both, upper and lower, faces by respective LPCVD silicon nitride layers 9 and 9'. The semi-finished product 10 may be obtained from a silicon wafer 8, preferably of thickness of about 380 μm, optically polished on both faces and then covered by an upper layer 9 and a lower layer 9' of LPCVD silicon nitride, having the desired thickness of the CMUT membranes to be made, for instance 1 μm. The orientation of the crystallographic planes of the silicon wafer 8 is preferably of (100) type.

Figure 5:
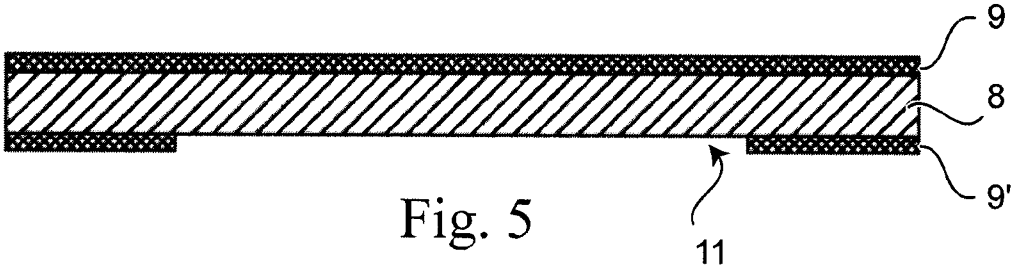

FIG. 5 shows that the first step of the process comprises making the windows 11 into the LPCVD silicon nitride lower layer 9', of area equal to the area of the transducer to make. In particular, the windows will contain one or more micro-cell bidimensional arrays which constitute the elements of the CMUT transducer. The windows 11, suitably aligned with the micro-cell bidimensional arrays which must be made on the opposite face (the upper one) of the wafer 8, will constitute the passageway through which the final anisotropic etching of the silicon substrate 8 will be made, as it will be described below.

Once the windows 11 are made, the next machining step occurs on the other face, the upper one, of the wafer 8.

Figure 6:
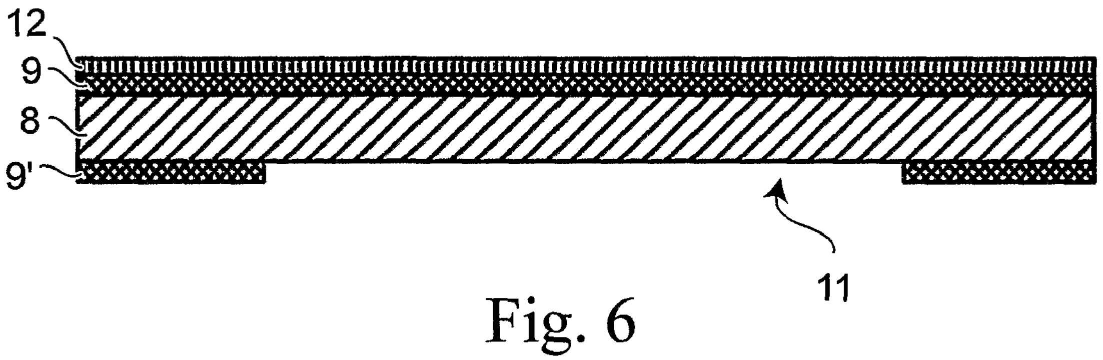

In particular, as shown in FIG. 6, the process comprises a step of making, preferably through evaporation, a layer 12, preferably of gold, placed onto the silicon nitride upper layer 9. The gold layer 12 integrates the front electrodes (i.e. those in contact with the emitting membranes) of the micro-cells which will be made on the whole wafer 8.

Figure 7:
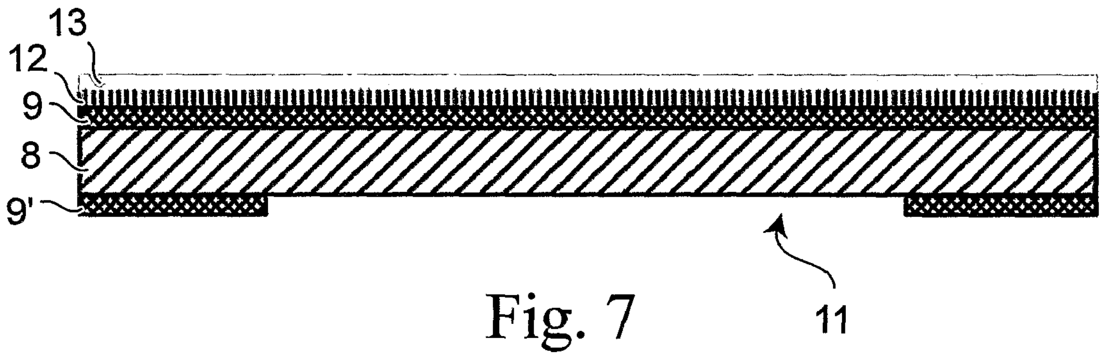

Afterwards, as shown in FIG. 7, the process comprises a step of making, preferably still through evaporation, a sacrificial layer 13 of chromium placed onto the gold layer 12.

Figure 8:
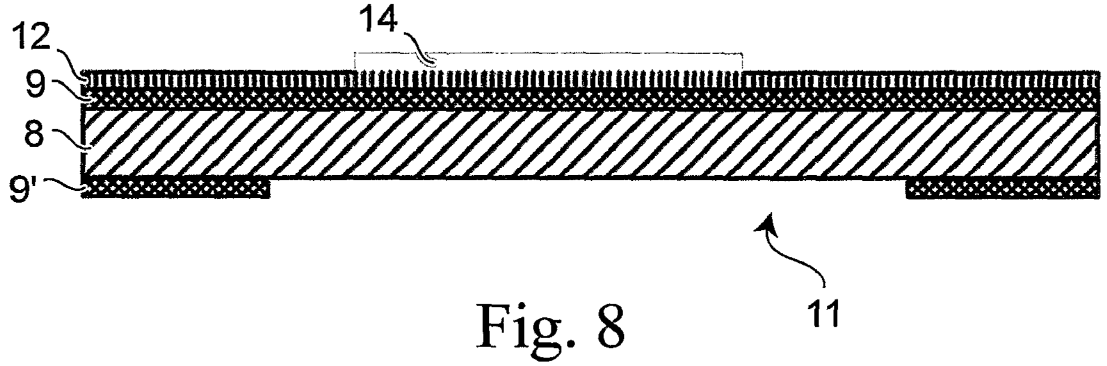

As shown in FIG. 8, the process comprises a step in which the pattern of sacrificial islands is defined in the chromium layer, preferably through optical lithography followed by wet etching of chromium, so as to form, for each micro-cell to make, a cylindrical relief 14, preferably of diameter of some tens of microns, that in the next operating steps will constitute the cavity of the corresponding micro-cell.

Figure 9:
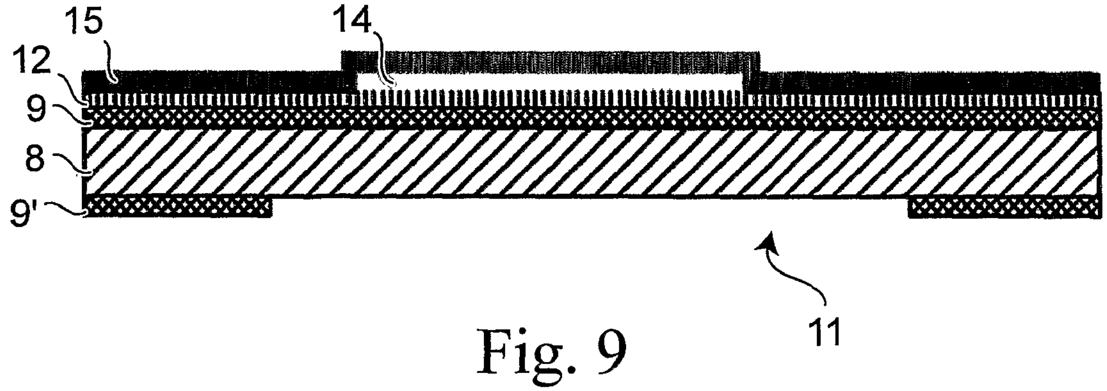

FIG. 9 shows that the machining then comprises a deposition of a layer 15 of PECVD silicon nitride, necessary for making the transducer backplate, having a thickness preferably not lower than 400 nm.

Figure 10:
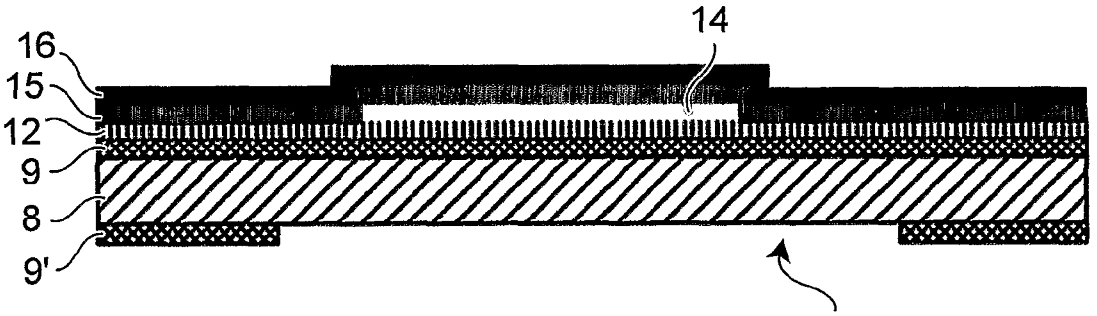
Figure 11:
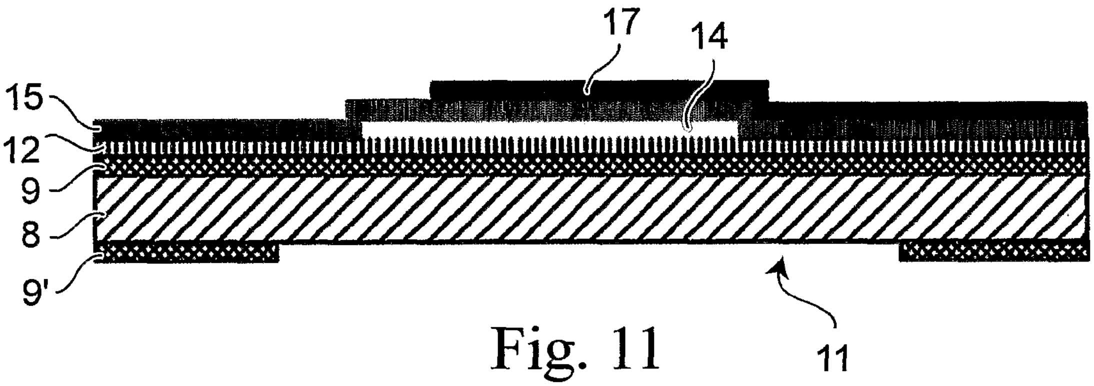

As shown in FIG. 10, the next step comprises making a conformal coverage in a metallic layer 16, preferably of an aluminium and titanium alloy, that is then lithographically defined, as shown in FIG. 11, for forming, for each micro-cell, the back electrode 17 (i.e. the electrode in contact with the base of the micro-cell cavity), separated from the corresponding front electrode, previously made through the gold layer 12, by a distance equal to the sum of the thicknesses of the chromium sacrificial island 14 with the backplate silicon nitride layer 15.

Figure 12:
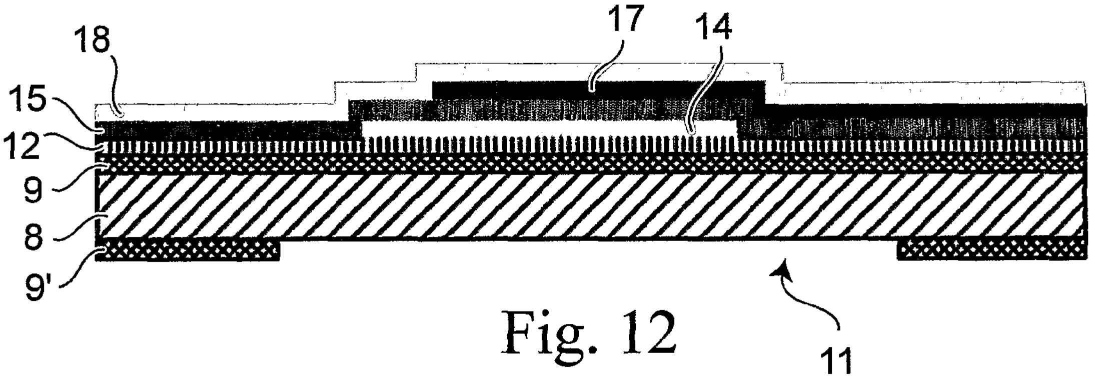

As shown in FIG. 12, the process then comprises a step of covering the back electrodes 17 with a protective dielectric film 18, preferably still of silicon nitride conformally deposited on the whole wafer surface with the plasma enhanced chemical vapour deposition technique or PECVD deposition.

Figure 13:
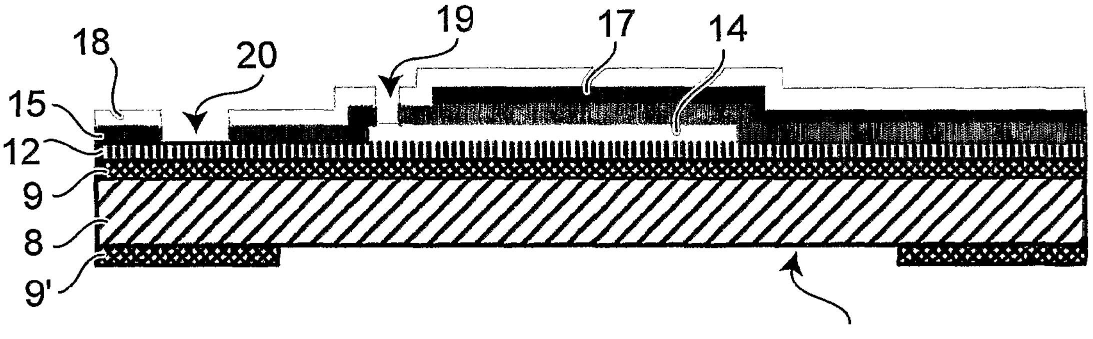

At this point of the process, it is necessary to empty the transducer micro-cells by eliminating the chromium of the sacrificial islands 14. As a consequence, as shown in FIG. 13, a step of creation of holes 19, preferably through lithography and etching, into the dielectric film 18 and into the silicon nitride layer 15 in correspondence with the chromium sacrificial islands 14 is carried out. Preferably, such holes 19 have size of some microns. Moreover, in such step areas for making pads contacting the front electrodes of the gold layer 12 are further defined, by creating suitable apertures 20.

Figure 14:
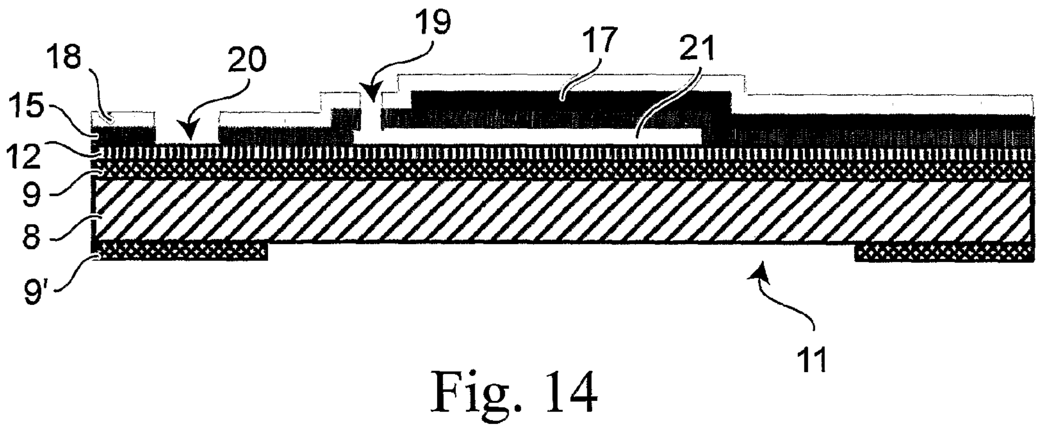

As shown in FIG. 14, it is then carried out a step for etching chromium, that removes the sacrificial islands 14 and creates the micro-cell cavities 21.

Figure 15:
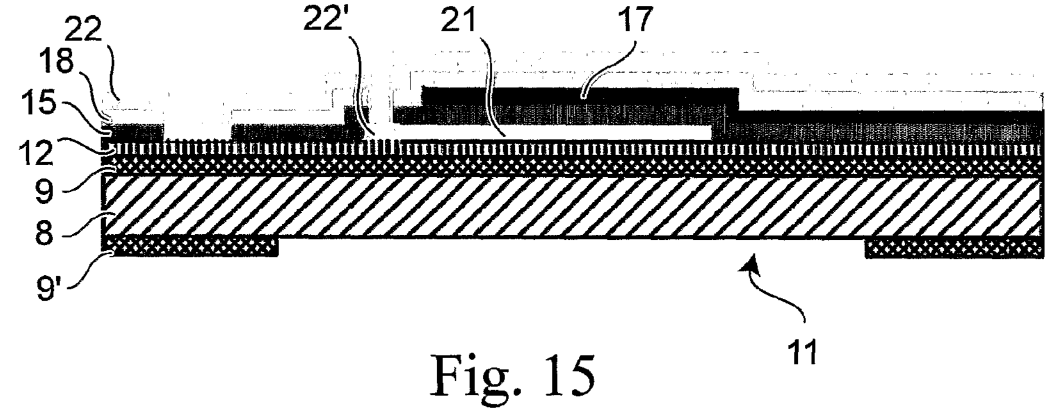

Afterwards, as shown in FIG. 15, the thus obtained cavities 21 are hermetically sealed, preferably through a further conformal deposition of PECVD silicon nitride, of thickness sufficient to make caps 22' for closing the cavities 21, in which such last layer of PECVD silicon nitride is indicated by the reference number 22.

Figure 16:
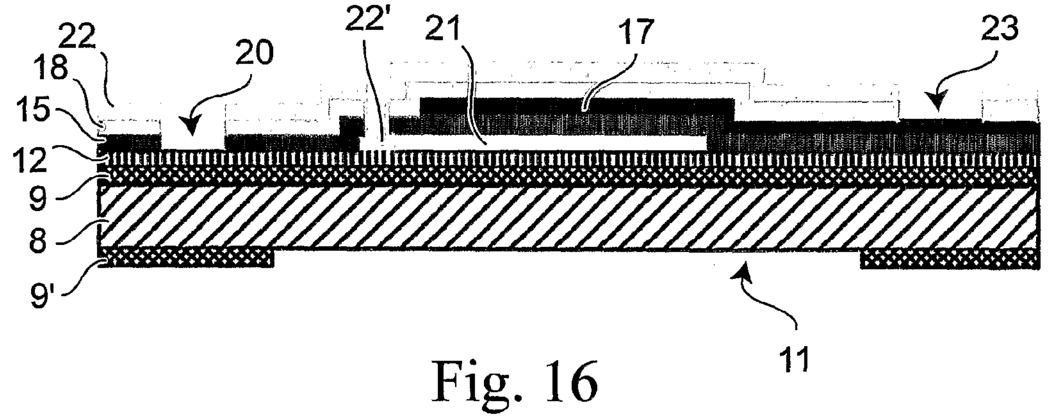

FIG. 16 schematises the step for making apertures 20 and 23, preferably through lithography and etching of the last layer 22 of silicon nitride, necessary for opening the pads contacting the front and back electrodes 12 and 17, respectively.

Figure 17:
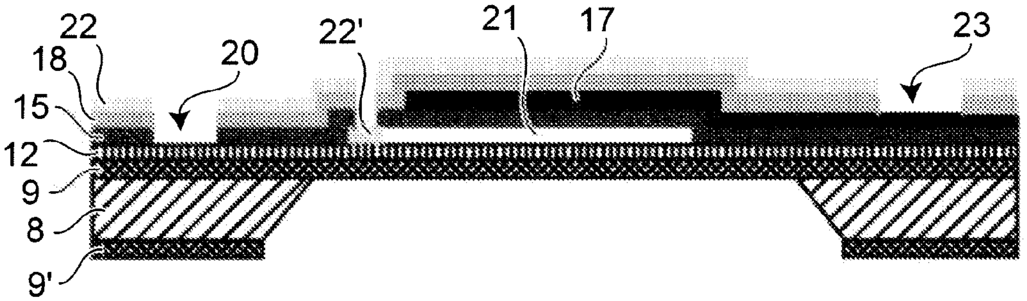
Figure 1:
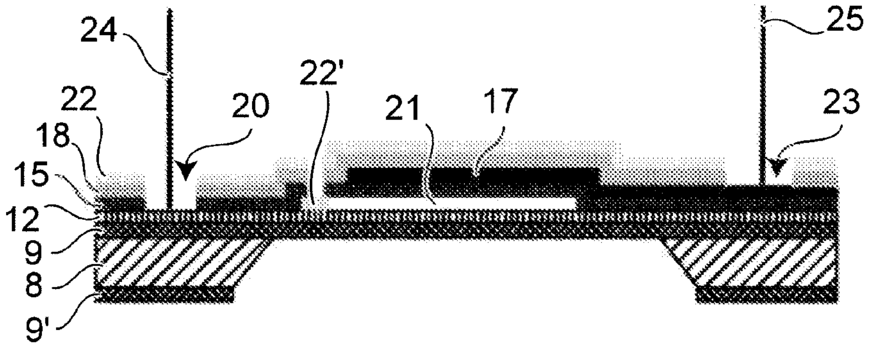
Figure 1:
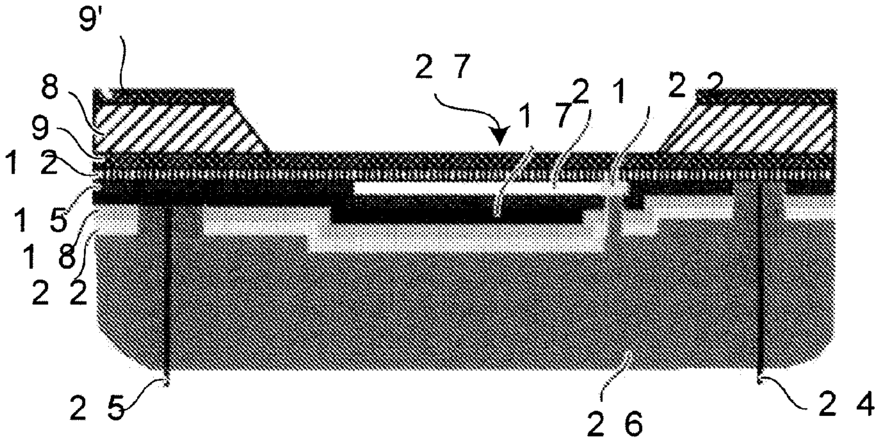

FIG. 17 shows that next step comprises anisotropic etching of silicon of the wafer 8 for removing all the silicon in correspondence with the windows 11, that is in correspondence with the cavities 21 made on the back face of the starting semi-finished product 10, preferably through a wet etching in potassium hydroxide (KOH).

As shown in FIG. 18, it is then carried out a step of welding the transducer output metallic contacts 24 and 25 on the pads 20 and 23, respectively, located rearly with respect to the thus made CMUT transducers.

Finally, as shown in FIG. 19, the whole device is backwards covered by a layer 26 of thermosetting resin that operates as protection and mechanical support. In particular, FIG. 19 shows the vibrating membranes 27, integrated into the silicon nitride layer 9 of the starting semi-finished product 10, which are suspended over the cavities 21: differently from those of conventional CMUT transducers, such membranes lacks any breaks and/or holes.

The advantages offered by the process according to the invention, that uses a technique of both wafer surface and wafer bulk micromachining, are numerous.

First of all, it is possible to use for the vibrating membranes a structural silicon nitride that is grown with LPCVD technique, substantially lacking any porosity and having better mechanical characteristics with respect to those obtained through PECVD technique.

Moreover, the membranes constituting the transducer cells, are perfectly planar, lacking any breaks and holes which could compromise its mechanical stability along time.

Still, it is possible to freely reduce the thickness of the silicon nitride layer 15 forming the backplate, with consequent reduction of the distance between the front and back electrodes 12 and 17, allowing very high sensitivity and reliable CMUT transducers operating at extremely high frequencies to be made.

Furthermore, making of weldings 24 and 25 for interfacing with the control electronics is carried out on the transducer back part, thus solving the packaging problems of conventional transducers. In particular, the process according to the invention eliminates the need of using sophisticated packaging techniques, and it allows electrical connections between the manufactured CMUT transducers and the corresponding (preferably flexible) printed circuits to be made through the so-called flip-chip bonding technique, in which the transducers are mounted on respective printed circuits with pads directed towards the latter.

Finally, the process according to the invention comprises a number of lithographic machining steps lower than that of conventional processes, having only five lithographies and five depositions of thin films, thus allowing an advantageous reduction of the number of needed masks.

The preferred embodiments have been above described and some modifications of this invention have been suggested, but it should be understood that those skilled in the art can make other variations and changes, without so departing from the related scope of protection, as defined by the following claims.

The invention claimed is:

1. A surface micromechanical process for manufacturing one or more micromachined capacitive ultra-acoustic transducers, each one of which comprises one or more electrostatic micro-cells, each micro-cell comprising a membrane of conductive elastic material suspended over a conductive substrate, comprising the steps of:

A. providing a semi-finished product comprising a silicon wafer having a face covered by a first layer of elastic material, depositing above the first elastic material layer covering said face, a first metallic layer, B. making, above the first metallic layer and outside the silicon wafer, the conductive substrate of at least one micro-cell so that it is separated from the first metallic layer by a cavity; and C. in correspondence with said at least one micro-cell, removing the silicon wafer, starting from the face opposite to that covered by the first elastic material layer to uncover the surface of the first elastic material layer, whereby, the conductive elastic material membrane comprises at least one portion of the first elastic material layer and at least one corresponding portion of the first metallic layer, that is capable to operate as a front electrode of said at least one micro-cell.

2. A process according to claim 1, wherein the elastic material of the first layer covering said face of the silicon wafer comprises silicon nitride.

3. A process according to claim 2, wherein the silicon nitride of the first layer covering said face of the silicon wafer is obtained through low pressure chemical vapour deposition or LPCVD deposition.

4. A process according to claim 1, wherein the first metallic layer is deposited onto the first elastic material layer through evaporation.

5. A process according to claim 1, wherein the first metallic layer comprises gold.

6. A process according to claim 1, wherein step B comprises:

B.2 making a sacrificial layer above the first metallic layer;

B.3 for said at least one micro-cell, defining a corresponding sacrificial island within the sacrificial layer;

B.4 making, above the sacrificial island, a layer of backplate of said one or more micromachined capacitive ultra-acoustic transducers;

B.5 making at least one hole within the backplate layer in correspondence of the sacrificial island;

B.6 removing the sacrificial island, thus creating the cavity of said at least one micro-cell;

B.7 making a sealing conformal layer for sealing said at least one hole through at least one corresponding closing cap obtained from the sealing conformal layer.

7. A process according to claim 6, wherein in step B.2, the sacrificial layer is made through evaporation.

8. A process according to claim 6, wherein the sacrificial layer comprises chromium.

9. A process according to claim 6 wherein the sacrificial island defined in step B.3 has a substantially circular shape.

10. A process according to claim 6 wherein step B.3 defines the sacrificial island through optical lithography followed by selective etching, of said sacrificial layer.

11. A process according to claim 6 wherein, in step B.4, the backplate layer comprises silicon nitride made through plasma enhanced chemical vapour deposition, or PECVD deposition.

12. A process according to claim 6, wherein the backplate layer has thickness not lower than 400 nm.

13. A process according to claim 6, wherein in step B.5, said at least one hole is made through optical lithography followed by selective etching said backplate layer.

14. A process according to claim 6, wherein in step B.6, the sacrificial island is removed through selective etching.

15. A process according to claim 6, wherein in step B.7, the sealing conformal layer comprises silicon nitride made through PECVD deposition.

16. A process according to claim 6 wherein it comprises, after step B.4 and before step B.7, the following step:

B.8 for said at least one micro-cell, making a corresponding back metallic electrode above the backplate layer.

17. A process according to claim 16, wherein in step B.8, the back metallic electrode is made by making a second conformal metallic layer that is afterwards defined through optical lithography followed by selective etching of said conformal metallic layer.

18. A process according to claim 16, wherein the back metallic electrode comprises an alloy of aluminium and titanium.

19. A process according to claim 16 wherein step B.8 is carried out before step B.5.

20. A process according to claim 16 wherein it comprises, just after step B.8, the following step:

B.9 covering the back metallic electrode with a conformal protective dielectric film.

21. A process according to claim 20, wherein the conformal protective dielectric film comprises silicon nitride made through PECVD deposition.

22. A process according to claim 6 wherein in step B.5, one or more apertures are made for uncovering areas corresponding to one or more pads contacting the front electrode of said at least one micro-cell.

23. A process according to claim 22, wherein in step B.5, said one or more apertures are made through optical lithography followed by selective etching.

24. A process according to claim 6 wherein it further comprises, after step B.7, the following step:

B.10 making one or more first apertures, for uncovering areas corresponding to one or more pads contacting the front electrode of said at least one micro-cell, and one or more second apertures, for uncovering areas corresponding to one or more pads contacting the back electrode of said at least one micro-cell.

25. A process according to claim 24, wherein in step B.10, said one or more first apertures are made through optical lithography followed by selective etching.

26. A process according to claim 24, wherein it further comprises, after step B.10, the following step:

B.11 welding respective metallic contacts on at least one of said one or more pads contacting the front electrode and on at least one of said one or more pads contacting the back electrode.

27. A process according to claim 6, wherein step B.3 defines the sacrificial island through optical lithography followed by wet etching of said sacrificial layer.

28. A process according to claim 1, wherein step C comprises anisotropically etching the silicon of the wafer.

29. A process according to claim 28, wherein step C comprises anisotropically etching the silicon of the wafer in potassium hydroxide (KOH).

30. A process according to claim 1, wherein it further comprises, after step B, the following step:

D. covering the conductive substrate of said at least one micro-cell with a protective layer.

31. A process according to claim 1, wherein said face of the silicon wafer, opposite to that covered by the first elastic material layer, is covered by a second layer of elastic material, the process further comprising, before step C, the following step:

E. making, in correspondence with said at least one micro-cell, a respective window within said second elastic material layer.

32. A process according to claim 31, wherein the elastic material of the second layer is the same elastic material as the first elastic material layer.

33. A process according to claim 31, wherein in step E, the window is made through optical lithography and selective etching of the second elastic material layer.

34. A process according to claim 1, wherein the first elastic material layer that is at least partially integrated into said membrane of said at least one micro-cell has a thickness of 1 μm.

35. A process according to claim 1, wherein the silicon wafer has an orientation of the crystallographic planes of (100) type.

36. A process according to claim 1, wherein the silicon wafer has at least the face covered by the first elastic material layer that is optically polished.

37. A process according to claim 1, wherein it further comprises, after step B, the following step:

D. covering the conductive substrate of said at least one micro-cell with a protective layer of a thermosetting resin.

38. A surface micromechanical process for manufacturing one or more micromachined capacitive ultra-acoustic transducers, each one of which comprises one or more electrostatic micro-cells, each micro-cell comprising a membrane of conductive elastic material suspended over a conductive substrate, comprising the steps of:

A. providing a semi-finished product comprising a silicon wafer having a face covered by a first layer of elastic material, depositing above the first elastic material layer covering said face, a first metallic layer, B. making, above the first metallic layer and outside the silicon wafer, the conductive substrate of at least one micro-cell so that it is separated from the first metallic layer by a cavity, by a method comprising:

B.2 making a sacrificial layer above the first metallic layer;

B.3 for said at least one micro-cell, defining a corresponding sacrificial island within the sacrificial layer;

B.4 making, above the sacrificial island, a layer of backplate of said one or more micromachined capacitive ultra-acoustic transducers;

B.5 making at least one hole within the backplate layer in correspondence of the sacrificial island, and making one or more apertures for uncovering areas corresponding to one or more pads contacting the front electrode of said at least one micro-cell;

B.6 removing the sacrificial island, thus creating the cavity of said at least one micro-cell;

B.7 making a sealing conformal layer for sealing said at least one hole through at least one corresponding closing cap obtained from the sealing conformal layer;

C. in correspondence with said at least one micro-cell, removing the silicon wafer, starting from the face opposite to that covered by the first elastic material layer to uncover the surface of the first elastic material layer, whereby, the conductive elastic material membrane comprises at least one portion of the first elastic material layer and at least one corresponding portion of the first metallic layer, that is capable to operate as a front electrode of said at least one micro-cell.

39. A process according to claim 38, wherein in step B.5, said one or more apertures are made through optical lithography followed by selective etching.

40. A surface micromechanical process for manufacturing one or more micromachined capacitive ultra-acoustic transducers, each one of which comprises one or more electrostatic micro-cells, each micro-cell comprising a membrane of conductive elastic material suspended over a conductive substrate, comprising the steps of:

A. providing a semi-finished product comprising a silicon wafer having a face covered by a first layer of elastic material, depositing above the first elastic material layer covering said face, a first metallic layer, B. making, above the first metallic layer and outside the silicon wafer, the conductive substrate of at least one micro-cell so that it is separated from the first metallic layer by a cavity by a method comprising:

B.2 making a sacrificial layer above the first metallic layer;

B.3 for said at least one micro-cell, defining a corresponding sacrificial island within the sacrificial layer;

B.4 making, above the sacrificial island, a layer of backplate of said one or more micromachined capacitive ultra-acoustic transducers;

B.5 making at least one hole within the backplate layer in correspondence of the sacrificial island;

B.6 removing the sacrificial island, thus creating the cavity of said at least one micro-cell;

B.7 making a sealing conformal layer for sealing said at least one hole through at least one corresponding closing cap obtained from the sealing conformal layer and, after step B.7 the following step:

B.10 making one or more first apertures, for uncovering areas corresponding to one or more pads contacting the front electrode of said at least one micro-cell, and one or more second apertures, for uncovering areas corresponding to one or more pads contacting the back electrode of said at least one micro-cell;

and

C. in correspondence with said at least one micro-cell, removing the silicon wafer, starting from the face opposite to that covered by the first elastic material layer to uncover the surface of the first elastic material layer, whereby, the conductive elastic material membrane comprises at least one portion of the first elastic material layer and at least one corresponding portion of the first metallic layer, that is capable to operate as a front electrode of said at least one micro-cell.

41. A process according to claim 40, wherein in step B.10, said one or more first apertures are made through optical lithography followed by selective etching.

42. A process according to claim 40, wherein it further comprises, after step B.10, the following step:

B.11 welding respective metallic contacts on at least one of said one or more pads contacting the front electrode and on at least one of said one or more pads contacting the back electrode.

43. A process of claim 1, 38 or 40 wherein removing the silicon wafer includes digging the silicon wafer.

* * * * *